United States Patent [19]

Matsuda et al.

[11] 4,131,909
[45] Dec. 26, 1978

[54] SEMICONDUCTOR INTEGRATED CIRCUIT ISOLATED THROUGH DIELECTRIC MATERIAL AND A METHOD FOR MANUFACTURING THE SAME

[75] Inventors: Takashi Matsuda; Kazuo Niwa; Yasusuke Sumitomo, all of Yokohama, Japan

[73] Assignee: Tokyo Shibaura Electric Co., Ltd., Tokyo, Japan

[21] Appl. No.: 735,784

[22] Filed: Oct. 26, 1976

[30] Foreign Application Priority Data

Oct. 25, 1975 [JP] Japan .................. 50-128773

[51] Int. Cl.² .................. H01L 27/12; H01L 29/78; H01L 27/02; H01L 29/04
[52] U.S. Cl. .................. 357/49; 357/23; 357/41; 357/59; 357/67; 29/571
[58] Field of Search .................. 357/23, 41, 49, 59, 357/67

[56] References Cited

U.S. PATENT DOCUMENTS

| 3,191,061 | 6/1965 | Weimer | 357/41 |
| 3,381,182 | 4/1968 | Thornton | 357/49 |
| 3,407,479 | 10/1968 | Fordemwalt et al. | 357/49 |
| 3,475,664 | 10/1969 | DeVries | 357/49 |
| 3,514,676 | 5/1970 | Fa | 357/42 |
| 3,602,981 | 9/1971 | Kooi | 357/49 |
| 3,865,649 | 2/1975 | Beasom | 357/42 |
| 3,874,918 | 4/1975 | Nechtow et al. | 357/49 |
| 3,944,447 | 3/1976 | Magdo et al. | 357/49 |

Primary Examiner—William D. Larkins
Assistant Examiner—Gene M. Munson
Attorney, Agent, or Firm—Oblon, Fisher, Spivak, McClelland & Maier

[57] ABSTRACT

A semiconductor integrated circuit includes first and second island regions, surrounded by a bottomed dish-like dielectric layer formed on one side of a support body. A MOS transistor element is formed in the first island region, whose gate region is located at the bottom side of the island region. The gate electrode is connected to a bottom portion of the second island region, which is used as a gate electrode contact region, in the support body using a interconnection lead. There is a method for manufacturing the above device.

6 Claims, 13 Drawing Figures

SEMICONDUCTOR INTEGRATED CIRCUIT ISOLATED THROUGH DIELECTRIC MATERIAL AND A METHOD FOR MANUFACTURING THE SAME

BACKGROUND OF THE INVENTION

Field of Invention

This invention relates to a semiconductor integrated circuit whose island region is electrically isolated through a dielectric layer, and a method for manufacturing the same.

Description of the Prior Art

It is known that a digital integrated circuit using Metal Oxide Semiconductor Transistor (hereinafter referred to merely as MOS transistor) is superior to a circuit using bipolar transistors in such points as integration density, power consumption and ease of manufacture.

However, in operating speed, the former is inferior to the latter. To overcome this shortcoming of the MOS integrated circuit, namely to increase the operating speed, the SOS (Silicon on Sapphire or Spinel) technique was recently developed. This technique is as follows: after growing a silicon layer having 1 $\mu$m thickness on one surface of sapphire monocrystalline substrate by using epitaxial process, a selective etching is made to remove the epitaxial layer selectively, leaving some portions where circuit elements are formed. This technique has some merits as follows compared with the conventional one.

1) High speed of the circuit operation owing to the decrease of parasitic capacitance according to the decrease of PN junctions.

2) High integration density of the integrated circuit owing to the decrease of the area of isolation region between circuit elements. However, this SOS technique is accompanied with such inconvenient phenomenon as lattice defects owing to the difference of lattice constant and crystal construction between silicon and sapphire, occurrence of aluminum impurity by reaction of the sapphire substrate with silicon layer and warp of the sapphire substrate owing to the difference of the expansion coefficients of both. These increase the leakage current of the device two to three fold compared with bulk silicon's, which makes the power consumption high. Furthermore, the carrier mobility becomes smaller sharply, and accordingly, the operating speed of the integrated circuit is decreased. For these reasons, it is difficult to apply this SOS technique to CMOS (Complementary Metal Oxide Semiconductor) circuit and the Dynamic circuit.

On the other hand conventionally known is a semiconductor integrated circuit in which an electrical insulation is made between semiconductor elements using a dielectric layer. A plurality of semiconductor elements of the integrated circuit are arranged at a predetermined interval on one side of a semiconductor polycrystalline layer, and a dielectric layer or insulator separation layer is formed in a manner to insulate the semiconductor elements from the polycrystalline layer. In this integrated circuit, the floating capacitance is very small, so that high break down voltage is obtained. Accordingly the abovementioned technique is especially used in the bipolar integrated circuit in which the thickness of monocrystalline layer is about 3 $\mu$m to 10 $\mu$m, so that therefore, the scatter of the thickness is of little matter.

However in the MOS integrated circuit, the thickness of the monocrystalline layer is about 1 $\mu$m. Accordingly it is very difficult to make the thickness constant within a scattering value of $\pm 0.1$ $\mu$m using a lapping method or an etching process. Therefore, application of this technique to the MOS integrated circuit is very difficult.

Furthermore, in the process where a polycrystalline layer is formed by gas phase growth, at first the size of a polycrystalline particle is small. However it becomes larger and larger with the advance of the polycrystalline growth, which causes a warp of the semiconductor substrate owing to the difference of the expansion coefficient of the polycrystalline layer in the direction of its depth. Furthermore, warping occurs also owing to the difference of expansion coefficient between the polycrystalline layer and the monocrystalline layer in which the semiconductor element is formed. This warp of the semiconductor substrate is difficult to be got rid of, and make the subsequent photoetching process difficult.

For these reasons, the prior art as above mentioned is unsuitable for manufacturing the semiconductor integrated circuit.

SUMMARY OF THE INVENTION

This invention overcomes the problems arising from the processing sequence and the construction of the prior art wherein the polycrystalline layer is grown by gas phase.

One object of this invention is to provide a method capable of easily manufacturing a semiconductor integrated circuit isolated through dielectric material.

Another object of this invention is to provide a semiconductor integrated circuit having an island region isolated through dielectric material, and having a MOS transistor element in the island region, whose gate region is located at the bottom side of the island region.

Yet another object of this invention is to provide a semi-conductor integrated circuit without warp of the support body.

Further object of this invention is to provide a semiconductor integrated circuit whose power consumption is small and operating speed is very high.

In one aspect of this invention, a semiconductor integrated circuit comprises a support body, at least one bottomed enclosed dielectric layer whose one end is open at one surface of the support body forming an island region, a MOS transistor element in the island region having source, drain and gate regions, wherein said source and drain regions are formed adjacent to said one surface of the support body and the gate region is formed at a bottom portion of the island region.

In another aspect of this invention, a method for manufacturing a semiconductor integrated circuit comprises the steps of: forming a mask layer on one side surface of first semiconductor substrate having first conductivity; removing at least two portions of the mask layer; etching the semiconductor substrate down to a predetermined depth through the exposed portions thereof to form first and second mesa regions; forming a gate insulating layer at a portion on the top surface of the first mesa region; forming source and drain regions in the first mesa region and gate electrode contact region in second island region so as to reach to the bottom of the mesa regions respectively, by diffusing an impurity having second conductivity type forming a gate electrode on said gate insulating layer and an interconnection lead which connects said gate electrode and said gate electrode contact region; growing a insulating layer which surrounds the mesa regions to form island regions; fitting a second substrate to said first semiconductor substrate including said island regions using a glass adhesive plaster at low temperature; etching the first semiconductor substrate to exposure said source, drain and gate electrode contact regions, forming source electrode, drain electrode and gate outer electrode on the exposure surface of said island region, contacting to said exposed regions respectively.

BRIEF DESCRIPTION OF THE DRAWINGS

This invention will now be explained in reference to the accompanying drawings, in which.

DESCRIPTION OF THE PREFERRED EMBODIMENTS

There will now be discussed a semiconductor integrated circuit according to one embodiment of this invention with reference FIGS. 1 and 2.

Figure 1:
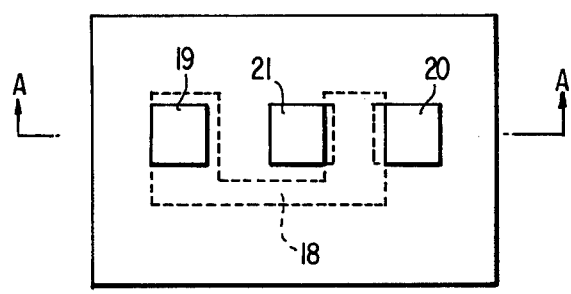
FIG. 1 is a plan view showing an embodiment of this invention.
Figure 2:
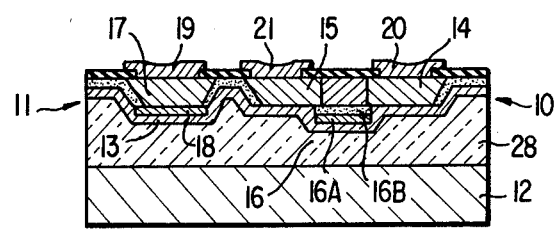
FIG. 2 is a sectional view taken along the A—A line of FIG. 1 showing an embodiment of this invention.

In FIGS. 1 and 2, a MOS transistor in a semiconductor integrated circuit according to this invention is shown Two island regions (10), (11) are formed in the glass layer (28) on the semiconductor substrate (12), surrounded by a dielectric layer (13), made of $SiO_2$. In one island region (10), a MOS transistor having a source region (14), a drain region (15) and a gate region (16), and in another island region (11) a gate electrode contact region (17) are formed, in which the gate region (16) is formed at a bottom portion of the island region (10) and gate electrode (16A) is connected to the gate electrode contact region (17) by interconnection lead (18). The gate electrode contact region (17) is formed at the same time when source region (14) and drain region (15) are formed by diffusing an impurity. Finally, gate outer electrode (19), source electrode (20) and drain electrode (21) are formed at apertures of the $SiO_2$ layer on the surface of the island regions (10), (11). Gate electrode (16A) and interconnection lead (18) are made of doped polysilicon layer.

Explanation is now made upon reference to FIGS. 3A to 3J, of a method of manufacturing a semiconductor integrated circuit of the above construction.

Figure 3A:
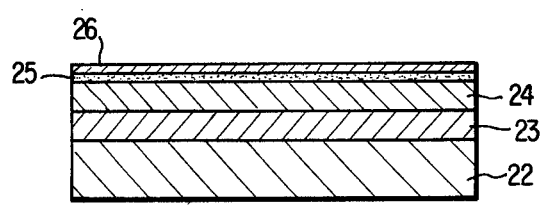
FIGS. 3A to 3J are process views for explaining a method for manufacturing a semiconductor integrated circuit as shown in FIGS. 1A and 1B.

In FIG. 3A, use is made of a n conductive type silicon wafer (22) whose top surface is oriented to a (100) face and whose specific resistance is below 0.005 Ωcm, and having the thickness of 300 μm.

The wafer (22) has on the top surface a layer (23) of p conductive type having a resistivity above 1 Ωcm and a thickness of 4 μm, which is epitaxially grown using a known epitaxial vapour growth method. Subsequently, n conductive type epitaxial layer (24) having a resistivity of 5 Ωcm and a thickness of 1.3 μm is formed on the p conductive type layer (23). Furthermore a thermal oxide layer (25) having 700 A thickness and a silicon nitride film (26) having 1000 A thickness are formed on the n conductive type layer (24) successively as masking layers, using C.V.D. (Chemical Vapour Deposition) method.

Figure 3B:
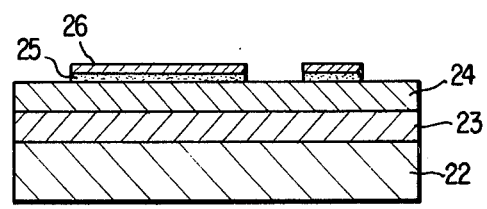

Then, as shown in FIG. 3B, selective etching is made so as to expose the n conductive type layer (24) leaving a corresponding portion where island regions are to be formed, using hydrazine as etchant.

Figure 3C:
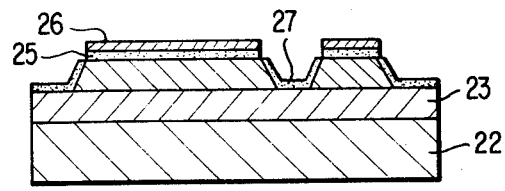
Figure 3D:
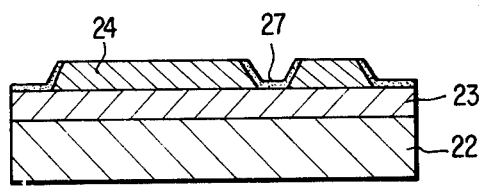
Figure 3E:
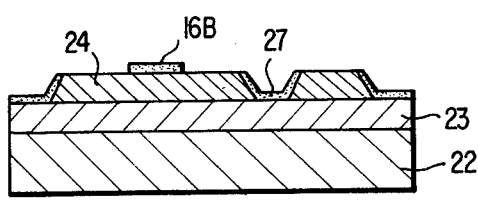
Figure 3F:
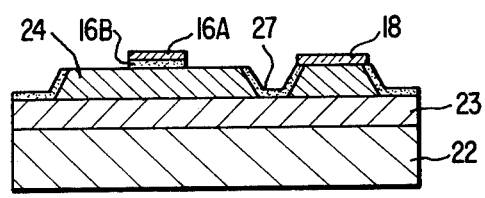
Figure 3G:
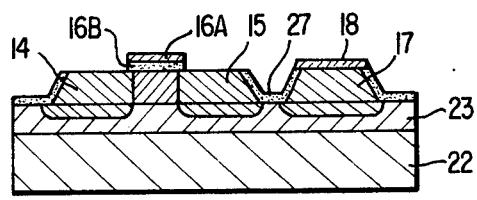
Figure 3H:
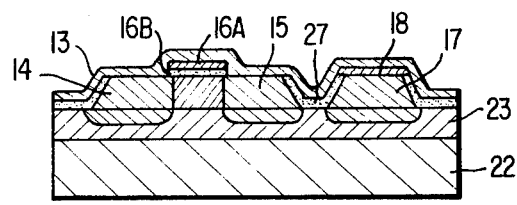
Figure 3I:
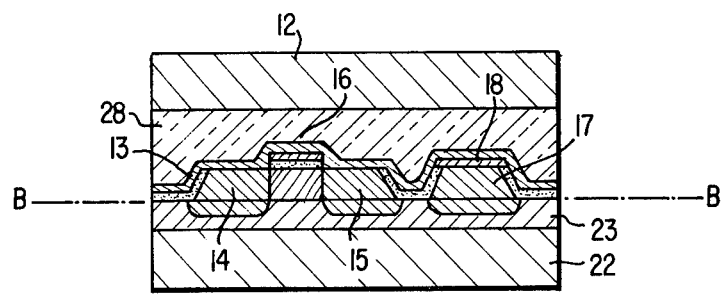
Figure 3J:
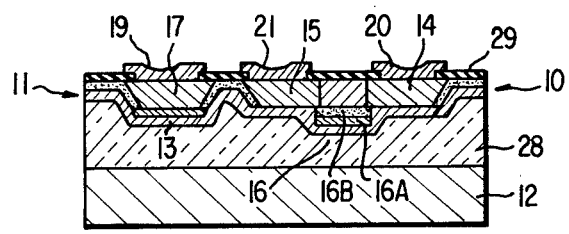

Likewise, as shown in FIG. 3C selective etching is made to remove the portions of the layer (24) not covered by the mask layers (25)(26), and thermal oxide layer (27) having 6000 A thickness is grown over the surface of the epitaxial layer except where covered by the masking layers (25)(26). Subsequently as shown in FIG. 3D the masking layers are removed, for instance silicon nitride film (26) is removed by plasma etching method, and thermal oxide layer (25) is etched by fluoridation ammonium. In this process, thermal oxide layer (25) isn't all removed, because the thickness of the layer (27) is 6000 A, while that of the thermal oxide layer (25) is 1000 A. Next, as shown in FIG. 3E gate oxide layer (16B) is grown on a portion of the epitaxial layer (24) in the oxide atmosphere at 1100° C., and as shown in FIG. 3F polycrystalline layer is selectively grown to form interconnection lead (18) and gate electrode (16A). Subsequently, as shown in FIG. 3G boron as an impurity is diffused into the portions of epitaxial layer (24) where source, drain and gate electrode contact regions (14), (15) and (16) are to be formed. In this diffusion process, at the same time, the impurity is doped in the polycrystalline layers (16A), (18) to perfect interconnection lead (18) and gate electrode (16A) lowering the resistivity. As is well known the impurity penetrates in the polycrystalline layer (18) but not in the $SiO_2$ layer (16B). This diffusion is made so as to reach the layer (23). Furthermore, the gate electrode (16A) and interconnection lead (18) may be made of metal layer. In this case, the forming of source and drain regions must be made previous to the forming of gate electrode (16A) and interconnection lead (18). Then as shown in FIG. 3H $SiO_2$ layer (13) having 5000 A thickness is grown on the entire surface of the substrate using C.V.D. method about at 500° C. As shown in FIG. 3J, the semiconductor substrate having the abovementioned island regions is fitted to another semiconductor substrate (12) using PbO—$SiO_2$ system glass (28) as adhesive plaster, whose expansion coefficient is about equal to the monocrystalline silicon substrate's, at low temperature 500° C., where the warp of substrate doesn't happen. Then, substrate (22) and epitaxial layer (23) are etched away by some etchants down to B—B line. Firstly the substrate (22) is etched using a etchant consisting of HF, $HNO_3$ and $CH_3COOH$ and secondly epitaxial layer (23) is etched using hydrozine. Next, as shown in FIG. 3J on the etched surface of island regions, thermal oxide layer (29) having 6000 A thickness is formed, and drain, source and gate electrode contact portions of the thermal oxide layer are apertured. Subsequently, aluminum layer is evaporated on the thermal oxide layer and electrode contact portions of MOS transistor, and selective etching of the metal layer is made to form source electrode (20), drain electrode (21) and gate outer electrode (17).

Figure 4:
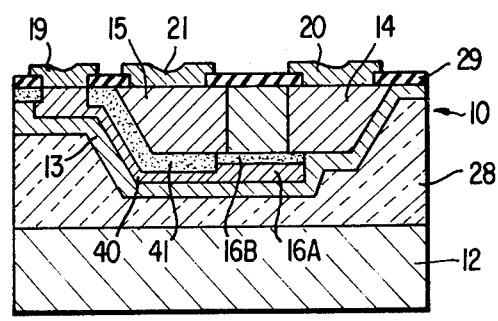
FIG. 4 is a section view showing a semiconductor integrated circuit according to another embodiment of this invention.

FIG. 4 shows another embodiment according to this invention. In this embodiment, gate electrode (16A) of MOS transistor is led out using inner lead (40) which extends to the surface of the island region, isolated from other regions by insulating layer (13)(41).

In this embodiment, the inner lead is made of aluminum metal layer or double metal layers of aluminum and titanium.

In summary, this invention provides several advantages over the prior art. Among these advantages are first, the warp of a support body doesn't happen because a semiconductor substrate including island region is fitted to another substrate at low temperature. Second the interconnection of circuit elements is easy and the integration density of the integration circuit becomes high because the interconnections can be made in the support body. Lastly, the method according to this invention hasn't a lapping process, therefore the manufacturing of the semiconductor integrated circuit becomes easy and accurate.

Although this invention has been disclosed and illustrated with reference to particular applications, the principles involved are susceptible of numerous other applications which will be apparent to those skilled in the art. The invention is, therefore, to be limited only as indicated by the scope of the amended claims.

What is claimed as new and desired to be secured by Letters Patent of the United States is:

1. A semiconductor integrated circuit comprising:
    a support body having a top surface and a first stepped recess in the top surface, the first recess having an upper step and a lower step;
    a dielectric layer coated uniformly over the top surface and the first recess;
    a first island region of material disposed over the dielectric layer in the first recess, the first island region forming a metal-oxide-semiconductor transistor element having separated source and drain regions on the upper step of the first recess and an insulated gate electrode on the lower step of the first recess.

2. A semiconductor integrated circuit recited in claim 1 wherein:
    the support body consists of a substrate and a glass layer on the substrate.

3. A semiconductor integrated circuit recited in claim 2 wherein:
    the glass layer is a Pb—SiO$_2$ system whose expansion coefficient is substantially the same as that of monocrystalline silicon.

4. The semiconductor integrated circuit recited in claim 1 wherein the first island region of material is doped with an impurity to lower its resistance; and the support body has a second recess in the top surface thereof, the dielectric layer being coated uniformly over the top surface and first and second recesses; and including a second island region of material disposed over the dielectric layer in the second recess, the second island region including a gate electrode contact region and interconnection means for electrically connecting the gate electrode contact region to the insulated gate electrode of the metal-oxide-semiconductor transistor element of the first island region; a first electrode led out from the source region of the metal-oxide-semiconductor transistor element; a second electrode led out from the drain electrode of the metal-oxide-semiconductor transistor element; and a third electrode led out from the gate electrode contact region.

5. The semiconductor integrated circuit recited in claim 4 wherein the interconnection means is a doped polycrystalline silicon layer.

6. A semiconductor integrated circuit comprising:
    a support body having a top surface and a stepped recess in the top surface, the recess having an upper step and a lower step;
    a dielectric layer coated uniformly over the top surface and the recess in the top surface;
    an island region of material disposed in the recess, the island region having a top surface and forming a metal-oxide-semiconductor transistor element having separated source and drain regions on the upper step of the recess and an insulated gate electrode on the lower step of the recess; and
    a gate outer electrode on the top surface of the island region, the gate outer electrode being led out from the gate electrode using a lead which extends to the top surface of the island region and is isolated from the source and drain regions by insulating layers.

* * * * *